US011209500B2

(12) United States Patent
Van Laere

(10) Patent No.: US 11,209,500 B2
(45) Date of Patent: Dec. 28, 2021

(54) NON-INTRUSIVE POWER QUALITY SENSOR

(71) Applicant: Maarten Van Laere, Heverlee (BE)

(72) Inventor: Maarten Van Laere, Heverlee (BE)

( * ) Notice: Subject to any disclaimer, the term of this patent is extended or adjusted under 35 U.S.C. 154(b) by 85 days.

(21) Appl. No.: 16/775,779

(22) Filed: Jan. 29, 2020

(65) Prior Publication Data

US 2020/0249282 A1 Aug. 6, 2020

Related U.S. Application Data

(60) Provisional application No. 62/799,896, filed on Feb. 1, 2019.

(51) Int. Cl.
*G01R 31/69* (2020.01)
*G01R 19/00* (2006.01)
*G01R 21/133* (2006.01)
*G01R 21/00* (2006.01)

(52) U.S. Cl.
CPC ......... *G01R 31/69* (2020.01); *G01R 19/0084* (2013.01); *G01R 21/133* (2013.01); *G01R 19/0092* (2013.01); *G01R 21/00* (2013.01)

(58) Field of Classification Search
CPC ........ G01R 31/00; G01R 31/50; G01R 31/66; G01R 31/68; G01R 31/69; G01R 19/00; G01R 19/0084; G01R 19/0092; G01R 21/00; G01R 21/133; G01R 23/00; G01R 23/16; G01R 23/20

USPC ..... 324/500, 537, 538; 702/1, 57, 66, 81, 84
See application file for complete search history.

(56) References Cited

U.S. PATENT DOCUMENTS

| 7,715,176 | B2* | 5/2010 | Perez | G01R 22/065 |
| | | | | 361/664 |
| 10,742,106 | B2* | 8/2020 | Chen | H02M 1/00 |
| 2012/0092114 | A1* | 4/2012 | Matthews | H01F 27/402 |
| | | | | 336/107 |
| 2013/0076343 | A1* | 3/2013 | Carpenter | G01R 19/00 |
| | | | | 324/202 |
| 2013/0320776 | A1* | 12/2013 | Cook | H02J 13/00036 |
| | | | | 307/126 |
| 2016/0047848 | A1* | 2/2016 | Chang | G01R 21/133 |
| | | | | 702/61 |
| 2016/0261143 | A1* | 9/2016 | Kuennen | A61L 2/10 |
| 2017/0102417 | A1* | 4/2017 | Juan | G01R 22/061 |

* cited by examiner

*Primary Examiner* — Hoai-An D. Nguyen
(74) *Attorney, Agent, or Firm* — White-Welker & Welker, LLC; Matthew T. Welker, Esq.

(57) ABSTRACT

A non-intrusive power quality sensor for to provide a simple solution for monitoring the quality of the power behind the meter. 80% of the quality issues happen behind the meter. Current power quality monitoring solutions are intrusive: they require the intervention of an electrical qualified person. The non-intrusive power quality sensor generally includes a device that can be plugged into a regular power outlet and acts as a power quality sensor.

21 Claims, 1 Drawing Sheet

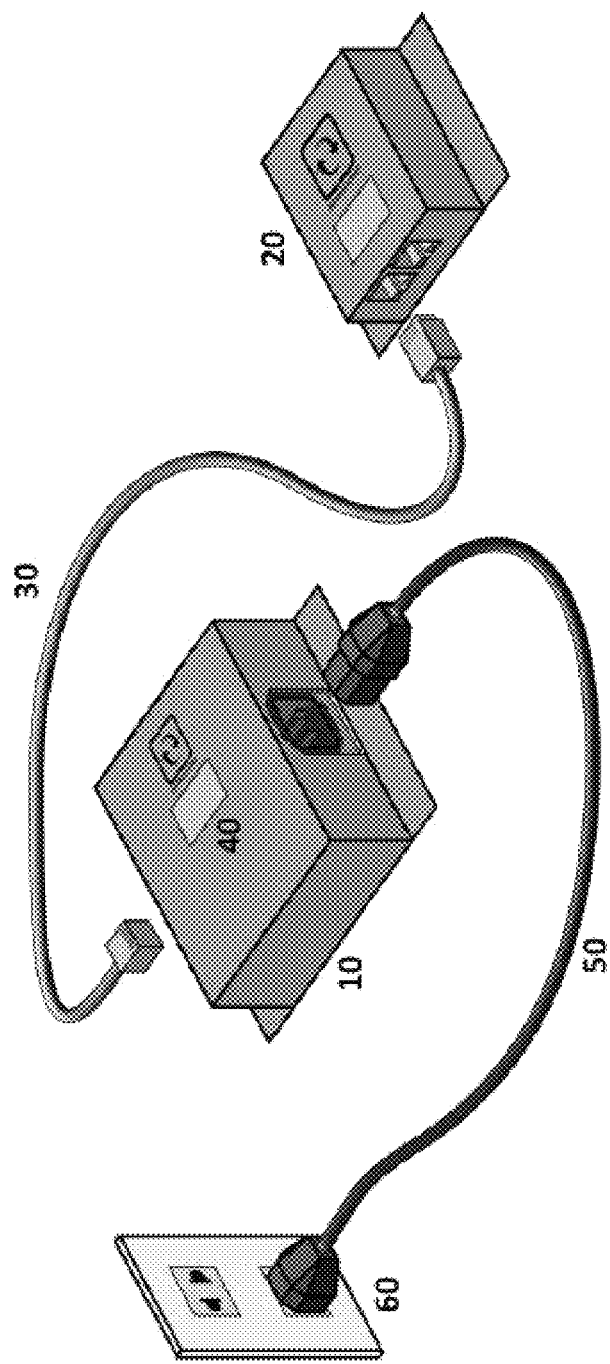

NON-INTRUSIVE POWER QUALITY SENSOR

FEDERALLY SPONSORED RESEARCH

Not Applicable

SEQUENCE LISTING OR PROGRAM

Not Applicable

TECHNICAL FIELD OF THE PRESENT INVENTION

The present invention relates generally to non-intrusive power quality sensors and more specifically it 5 relates to a non-intrusive power quality sensor for to provide a simple solution for monitoring the quality of the 6 power behind the meter. 80% of the quality issues happen behind the meter. Current power quality monitoring 7 solutions are intrusive: they require the intervention of an electrical qualified person.

BACKGROUND OF THE PRESENT INVENTION

The invention generally relates to a non-intrusive power quality sensor which includes a device that can be plugged into a regular power outlet and acts as a power quality sensor.

There has thus been outlined, rather broadly, some of the features of the invention in order that the detailed description thereof may be better understood, and in order that the present contribution to the art may be better appreciated. There are additional features of the invention that will be described hereinafter.

In this respect, before explaining at least one embodiment of the invention in detail, it is to be understood that the invention is not limited in its application to the details of construction or to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

An object is to provide a non-intrusive power quality sensor for to provide a simple solution for monitoring the quality of the power behind the meter. 80% of the quality issues happen behind the meter. Current power quality monitoring solutions are intrusive: they require the intervention of an electrical qualified person.

Another object is to provide a Non-intrusive Power Quality Sensor that is plug and play that can be simply plugged into a power socket using standard power cables.

Another object is to provide a Non-intrusive Power Quality Sensor that can be implemented by anyone and not just an electrical qualified person.

Another object is to provide a Non-intrusive Power Quality Sensor that can work standalone or can be connected to a base unit.

Another object is to provide a Non-intrusive Power Quality Sensor that is able to provide power quality data in an easy way to understand by anyone without requiring an electrical knowledge or background.

Other objects and advantages of the present invention will become obvious to the reader and it is intended that these objects and advantages are within the scope of the present invention. To the accomplishment of the above and related objects, this invention may be embodied in the form illustrated in the accompanying drawings, attention being called to the fact, however, that the drawings are illustrative only, and that changes 16 may be made in the specific construction illustrated and described within the scope of this application.

BRIEF DESCRIPTION OF THE DRAWINGS

The accompanying drawings, which are incorporated herein and form a part of the specification, illustrate the present invention and, together with the description, further serve to explain the principles of the present invention and to enable a person skilled in the pertinent art to make and use the present invention.

Various other objects, features and attendant advantages of the present invention will become fully appreciated as the same becomes better understood when considered in conjunction with the accompanying drawings, in which like reference characters designate the same or similar parts throughout the several views, and wherein:

FIG. 1 is a front view of the present invention. FIG. 1 shows a possible implementation of the invention consisting of a power quality sensor and a base unit.

DEFINITIONS

The power quality sensor is a device that analyzes the quality of the power in respect to the voltage quality and the total harmonics voltage distortion

INDEX OF ELEMENTS

10: Power Quality Sensor
20: Sensor Base Unit
30: Sensor Cable
40: Display
50: Power Cable
60: Power Wall Socket

DETAILED DESCRIPTION OF THE PRESENT INVENTION

In the following detailed description of the present invention of exemplary embodiments of the present invention, reference is made to the accompanying drawings (where like numbers represent like elements), which form a part hereof, and in which is shown by way of illustration specific exemplary embodiments in which the present invention may be practiced. These embodiments are described in sufficient detail to enable those skilled in the art to practice the present invention, but other embodiments may be utilized and logical, mechanical, electrical, and other changes may be made without departing from the scope of the present invention. The following detailed description is, therefore, not to be taken in a limiting sense, and the scope of the present invention is defined only by the appended claims.

In the following description, numerous specific details are set forth to provide a thorough understanding of the present invention. However, it is understood that the present invention may be practiced without these specific details. In other instances, well-known structures and techniques known to one of ordinary skill in the art have not been shown in detail in order not to obscure the present invention. Referring to the FIGURES, it is possible to see the various major elements constituting the apparatus of the present invention.

Turning now descriptively to the drawings, in which similar reference characters denote similar elements throughout the several views, the FIGURES illustrate a device that can be plugged into a regular power outlet and acts as a power quality sensor.

The power quality sensor is a device that analyzes the quality of the power in respect to the voltage quality and the total harmonics voltage distortion. It uses industry standards to perform those measurements. The data can be shown on a display on the device and/or made available to other systems. (element 10 in FIG. 1).

The power quality sensor (element 10 in FIG. 1) is an electronic device that analyzes the power coming from the connected power cable. The device is made in such a way that it complies with electrical standards in respect to how to monitor the two key metrics it monitors: voltage and total voltage harmonics distortion.

The sensor could also be programmed to monitor other power elements such as but not limited to, power failures. The data can be shown onto a display or made available using digital or analog communication protocols to other devices, applications or systems. For example, in FIG. 1, the device (element 10) is connected using a cable (element 30) to a sensor base unit (element 20).

The base unit (element 20 in FIG. 1) is the logical unit in a sensor platform that receives data from sensors, processes it and makes it available to other platforms; manages alerts like, but not limited to email, SNMP, SMS, voice calls.

The base unit (element 20 in FIG. 1) is a logic device that hosts one or multiple sensors that are connected in a wired or wireless connection to it. It may transform the data so that it can be processed by other systems, devices or applications. It can monitor the sensor metrics and generate alerts using multiple digital or analog alerting capabilities.

The invention could have an embodiment where a base unit is required but it could also have an embodiment without requiring a base unit. In that case the functionality of the base unit can be integrated into the device to form a single unit. It could also be connected to more than one base units.

The sensor cable (element 30 in FIG. 1) connects the invention to a sensor base unit. It transmits data and power.

The connection from the invention to the base unit could wired by using a sensor cable (element 30 in FIG. 1). The sensor cable is not essential to the invention. It could also be in a wireless configuration between the sensor and the base unit or any combination thereof.

The display (element 40 in FIG. 1) shows the power quality as sensed and as performed per industry standards but in such a way that it could be understood by a person without any electrical background.

The display (element 40 in FIG. 1) enables the user of the invention to see the status of the quality of the power, the most recent power abnormalities that were found. The messages on the display are designed in such a way that they are easy to understand without requiring special electrical knowledge.

The standard power cable is plugged into the device and on the other end of the cable is plugged into a standard power socket. (element 50 in FIG. 1).

The power cable (element 50) can be modular as in FIG. 1 or can be part of the invention. Another 1 embodiment of the invention is whereby the invention can be plugged directly into a power socket.

The power cable (element 50 in FIG. 1) can be plugged into a wall socket (element 60 in FIG. 1) or any other type of socket.

The power cable is a regular power cable that either be embedded or simply connected to the device and the power socket (element 60) as shown in FIG. 1.

The power cable can be directly or indirectly connected to the device. It could be part of the device or like in FIG. 1 connected using a power connector. It can be connected to a wall socket for ease of use. It could also be connected to a power switching board or in any other possible way to a power cable, direct or indirectly. In this embodiment it is connected to an AC power source but it could also be used for DC power sources where it would monitor the same and/or other power quality metrics relevant to the monitoring requirement.

Power quality is a common cause for equipment failure and has a huge impact on business operations. Currently power quality monitoring is an intrusive tasks required to be implemented and monitored by electrical trained professionals. Those systems look at power quality from a voltage and current perspective. With this invention power quality can be performed in a non intrusive way by anyone without requiring any electrical knowledge and all this in a safe way.

The invention computes the power quality and monitors if it is within defined thresholds. Those thresholds could be based on industry standards, user set metrics or any combination thereof.

Power quality data is made available in a format that anyone can understand. The data from the sensor can be used to have then more detailed analysis performed using other equipment.

Due to the unique way of doing power quality monitor by using a power cable that plugs into a power wall outlet or any other power outlet (as shown in FIG. 1), the invention will only look at power quality from a voltage and harmonics perspective. As it runs in parallel, current can not be monitored.

However statistics show that more than 90% of power quality issues are voltage related. By using this invention the vast majority of power quality issues can be detected and this in a non intrusive way.

The power quality sensor make the power quality data available in an easy to understand format using an OLED display. At the same time it connects to a base unit enabling the transmission of the power quality data to monitoring IT and building monitoring platforms.

The device could be used as a standalone device or connected to other systems, devices and applications for further processing and analysis.

What has been described and illustrated herein is a preferred embodiment of the present invention along with some of its variations. The terms, descriptions and FIGURES used herein are set forth by way of illustration only and are not meant as limitations. Those skilled in the art will recognize that many variations are possible within the spirit and scope of the present invention in which all terms are meant in their broadest, reasonable sense unless otherwise indicated. Any headings utilized within the description are for convenience only and have no legal or limiting effect.

Thus, it is appreciated that the optimum dimensional relationships for the parts of the present invention, to include variation in size, materials, shape, form, function, and manner of operation, assembly and use, are deemed readily apparent and obvious to one of ordinary skill in the art, and all equivalent relationships to those illustrated in the drawings and described in the above description are intended to be encompassed by the present invention.

Furthermore, other areas of art may benefit from this method and adjustments to the design are anticipated. Thus,

The invention claimed is:

1. A non-intrusive power quality sensor device that is plugged into a regular power outlet and acts as a power quality sensor, the device comprising:
   a power quality sensor;
   a base unit;
      the base unit is a logic device that hosts one or multiple sensors that are connected in a wired or wireless connection to it;
      the base unit transforms the data so that it is processed by other systems, devices, or applications; and
      the base unit monitors the sensor metrics and generate alerts using multiple digital or analog alerting capabilities;
   a sensor cable;
      the sensor cable connects the power quality sensor to the base unit; and
      the sensor cable transmits data and power;
   a display;
   a power cable;
      the power cable is plugged into the power quality sensor on one end and on the other end, the power cable is plugged into a power socket or outlet; and
   wherein the power quality sensor is plugged into a power socket or outlet and acts as a non-intrusive power quality sensor.

2. The device of claim 1, wherein
   the power quality sensor is a device that analyzes the quality of the power in respect to the voltage quality and the total harmonics voltage distortion of the power coming from the connected power cable.

3. The device of claim 2, wherein
   the data is shown on a display on the device and/or made available using digital or analog communication protocols to other devices, applications or systems.

4. The device of claim 1, wherein
   the sensor is programmed to monitor other power elements.

5. The device of claim 4, wherein
   the sensor is programmed to monitor power failures.

6. The device of claim 1, wherein
   the base unit is a logical unit in a sensor platform that receives data from sensors, processes it and makes it available to other platforms.

7. The device of claim 6, wherein
   the base unit; manages alerts including: email, SNMP, SMS, and voice calls.

8. The device of claim 1, wherein
   the display shows the power quality as sensed and as performed per industry standards.

9. The device of claim 1, wherein
   the display enables a user to see the status of the quality of the power, the most recent power abnormalities that were found; and
   the messages on the display are designed in such a way that they are easy to understand without requiring special electrical knowledge.

10. The device of claim 1, wherein
    the power cable is either modular or part of the device.

11. The device of claim 1, wherein
    the device is plugged directly into a power socket.

12. The device of claim 1, wherein
    the power cable is plugged into a wall socket or any other type of socket.

13. The device of claim 1, wherein
    the power cable is a regular power cable that either is embedded or simply connected to the device and the power socket.

14. The device of claim 1, wherein
    the power cable is either directly or indirectly connected to the device.

15. The device of claim 1, wherein
    the power cable is connected using a power connector.

16. The device of claim 1, wherein
    the power cable is connected to a wall socket.

17. The device of claim 1, wherein
    the power cable is connected to a power switching board to a power cable, either directly or indirectly.

18. The device of claim 1, wherein
    the power cable is connected to an AC power source or a DC power source, where it monitors the same and/or other power quality metrics relevant to the monitoring requirement.

19. The device of claim 1, wherein
    the functionality of the base unit is integrated into the power quality sensor to form a single unit; and
    the power quality sensor with an integrated base unit is connected to one or more additional base units.

20. The device of claim 1, wherein
    the connection from the power quality sensor to the base unit is wired by using a cable or it is connected in a wireless configuration between the power quality sensor and the base unit or any combination thereof.

21. The device of claim 1, wherein
    the non-intrusive power quality sensor computes the power quality and monitors if it is within defined thresholds; and
    those thresholds are based on either industry standards, user set metrics, or any combination thereof.

* * * * *